(12) United States Patent
Yamagata et al.

(10) Patent No.: US 11,385,260 B2
(45) Date of Patent: Jul. 12, 2022

(54) PROBE CARD HOLDING DEVICE AND INSPECTION DEVICE

(71) Applicant: Tokyo Electron Limited, Tokyo (JP)

(72) Inventors: Kazumi Yamagata, Yamanashi (JP); Tatsuo Kawashima, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/166,147

(22) Filed: Feb. 3, 2021

(65) Prior Publication Data

US 2021/0255217 A1    Aug. 19, 2021

(30) Foreign Application Priority Data

Feb. 17, 2020   (JP) .............................. JP2020-024503

(51) Int. Cl.
*G01R 1/073*   (2006.01)
(52) U.S. Cl.
CPC ................................ *G01R 1/07342* (2013.01)
(58) Field of Classification Search
CPC ............ G01R 1/07342; G01R 31/2886; G01R 1/07314; G01R 1/0466; G01R 31/2865; G01R 31/2889; G01R 1/06722; G01R 1/06; G01R 1/067; G01R 1/06705; G01R 1/06711; G01R 1/06716; G01R 1/06727; G01R 1/06733; G01R 1/06738; G01R 1/06744; G01R 1/0675; G01R 1/06755; G01R 1/06761; G01R 1/06766; G01R 1/06772; G01R 1/06777; G01R 1/073; G01R 1/07307; G01R 1/07321; G01R 1/07328; G01R 1/07335; G01R 1/0735; G01R 1/07357; G01R 1/07364; G01R 1/07371; G01R 1/07378; G01R 1/07385; G01R 1/07392
See application file for complete search history.

(56) References Cited

U.S. PATENT DOCUMENTS

2015/0276811 A1 * 10/2015 Yamada ............. G01R 31/2893
324/756.03
2019/0170816 A1 * 6/2019 Mardi ................ G01R 1/07371

FOREIGN PATENT DOCUMENTS

JP          2011-064659          3/2011

* cited by examiner

*Primary Examiner* — Lee E Rodak
(74) *Attorney, Agent, or Firm* — IPUSA, PLLC

(57) ABSTRACT

A probe card holding device includes: a frame that holds a probe card by vacuum suction; a sealing member provided on the frame and configured to form an enclosed space by contacting the probe card; a placement section in which a first engaging portion provided at an outer circumference of the probe card is placed when the probe card is attached to the frame; a second engaging portion configured to be engaged with the first engaging portion; and an actuator configured to drive the second engaging portion between a first position and a second position. When the second engaging portion is engaged with the first engaging portion in response to dissipation of the vacuum suction, the probe card is held by the probe card holding device while the sealing member maintains a seal with the probe card.

7 Claims, 5 Drawing Sheets

PROBE CARD HOLDING DEVICE AND INSPECTION DEVICE

CROSS-REFERENCE TO RELATED APPLICATIONS

This patent application is based upon and claims priority to Japanese Patent Application No. 2020-024503 filed on Feb. 17, 2020, the entire contents of which are incorporated herein by reference.

TECHNICAL FIELD

The present disclosure relates to a probe card holding device and an inspection device.

BACKGROUND

An inspection apparatus that tests electrical characteristics of semiconductor devices formed in a wafer is known. In the inspection apparatus, by placing the wafer and supplying current to the semiconductor devices formed in the wafer through probes or the like from a tester, the electrical characteristics of semiconductor devices are inspected.

Patent Document 1 describes a clamping mechanism of a probe card, which clamps the outer edge of a probe card to prevent the probe card from falling.

RELATED ART DOCUMENT

Patent Document

[Patent Document 1] Japanese Laid-open Patent Application Publication No. 2011-064659

SUMMARY

In one aspect, the present disclosure provides a probe card holding device and an inspection device that protects a probe card from getting damaged.

In order to solve the problem, according to one aspect, a probe card holding device for holding a probe card provided with a first engaging portion at its outer circumference is provided. The probe card includes a frame that holds the probe card by vacuum suction; a sealing member provided on the frame and configured to form an enclosed space by contacting the probe card; a placement section in which the first engaging portion of the probe card is placed when the probe card is attached to the frame; a second engaging portion configured to be engaged with the first engaging portion; and an actuator configured to drive the second engaging portion. The actuator is configured to switch a position of the second engaging portion between a first position in which the second engaging portion is placed to avoid the placement section and a second position in which the second engaging portion is placed to overlap the placement section. When the second engaging portion is engaged with the first engaging portion in response to dissipation of the vacuum suction, the probe card is held by the probe card holding device while the sealing member maintains a seal with the probe card.

DETAILED DESCRIPTION OF EMBODIMENTS

Figure 1:
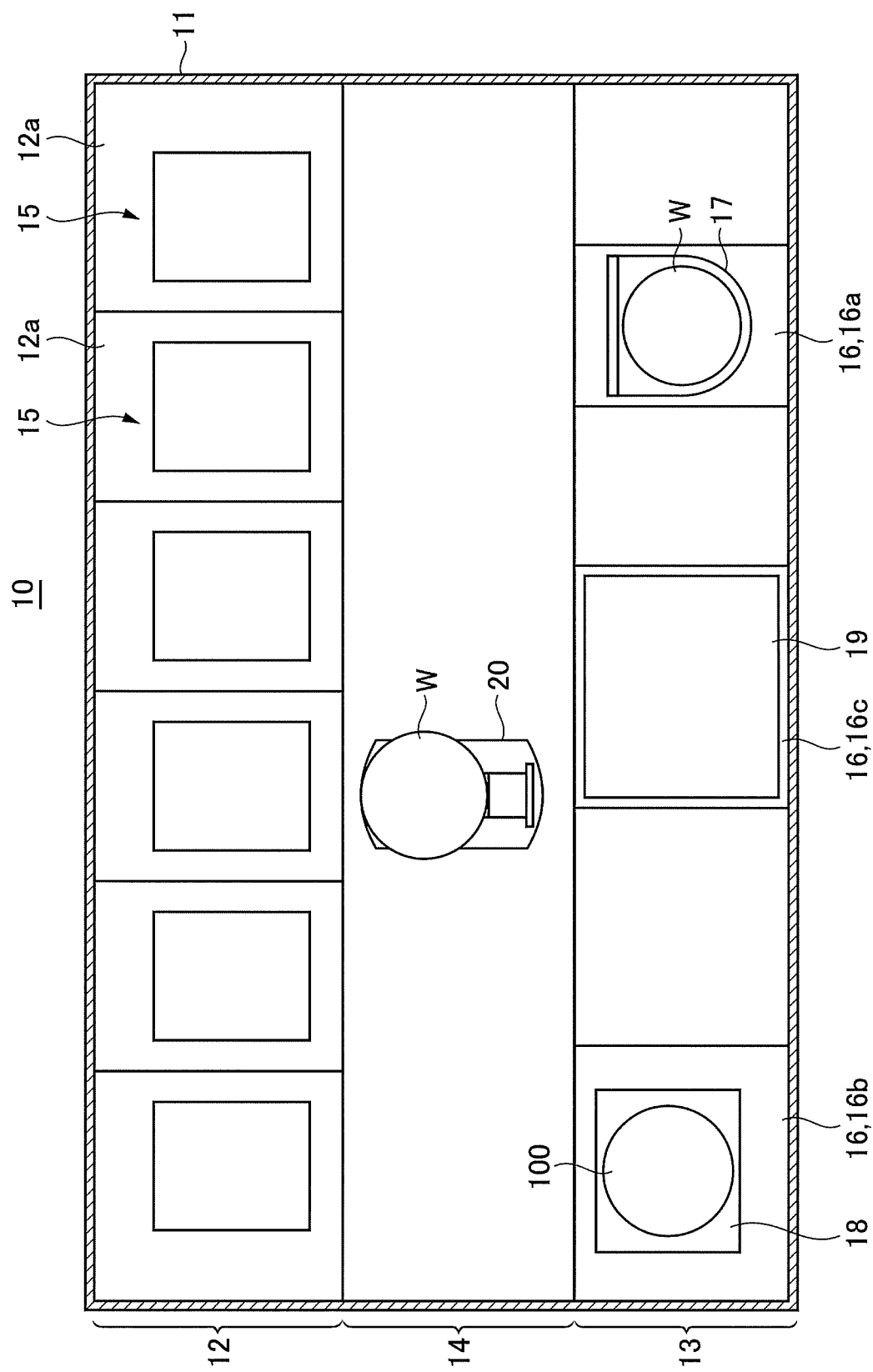
FIG. 1 is an example of a horizontal cross-sectional view schematically illustrating the configuration of a substrate inspection apparatus.

Hereinafter, an embodiment for carrying out the present disclosure will be described with reference to the drawings. In each drawing, the same components are indicated by the same reference numerals and overlapping descriptions may be omitted.

<Inspection Device>

A substrate inspection apparatus 10 according to the present embodiment will be described with reference to FIG. 1. FIG. 1 is an example of a horizontal cross-sectional view schematically illustrating the configuration of the substrate inspection apparatus 10 according to the present embodiment.

The substrate inspection apparatus 10 includes a housing 11. Within the housing 11, there is an inspection area 12, a loading/unloading area 13, and a transport area 14.

The inspection area 12 is an area in which electrical property inspection of each semiconductor device formed in the wafer W is carried out. Multiple inspection rooms 12a are provided in the inspection area 12. Each of the inspection rooms 12a is provided with an inspection device 15. Although FIG. 1 illustrates a case in which the inspection rooms 12a are arranged along a horizontal direction, arrangement of the inspection rooms 12a is not limited thereto. The inspection rooms 12a may be provided in the vertical direction.

The loading/unloading area 13 is an area where a wafer W or the like is loaded to or unloaded from the inspection area 12. The loading/unloading area 13 is divided into multiple storage spaces 16. Each of the storage spaces 16 includes, for example, a wafer loading/unloading port 16a, a probe card load port 16b, or a controller housing port 16c. The wafer loading/unloading port 16a accommodates a front opening unified (or universal) pod (FOUP) 17, which is a container that accommodates multiple wafers W. The probe card load port 16b accommodates a probe card loader 18 where the probe card 100 (see FIG. 2) is loaded and unloaded. The controller housing port 16c houses a controller 19 that controls operations of each component of the substrate inspection apparatus 10.

The transport area 14 is an area provided between the inspection area 12 and the loading/unloading area 13. A conveying device 20, which can move to the inspection area 12 or the loading/unloading area 13 as well as the transport area 14, is provided in the transport area 14. The conveying device 20 receives a wafer W from the FOUP 17 in the wafer loading/unloading port 16a, and transports the wafer W to the inspection device 15 in the inspection room 12a. In addition, the conveying device 20 conveys, from the inspection device 15 in each of the inspection rooms 12a, the wafer W whose electrical property inspection with respect to semiconductor devices has been completed, to the FOUP 17 in the wafer loading/unloading port 16a.

In the substrate inspection apparatus 10, each of the inspection devices 15 inspects an electrical property of semiconductor devices in a wafer W that is conveyed to itself. Here, while the conveying device 20 is transporting a wafer W toward one of the inspection devices 15, other inspection devices 15 can inspect electrical properties of semiconductor devices in other wafers W. This improves inspection efficiency of wafers W.

Also, the conveying device 20 receives the probe card 100 from the inspection device 15 in the inspection room 12a, and transfers the probe card 100 to the probe card loader 18 in the probe card load port 16b. The conveying device 20 also receives a new probe card 100 from the probe card loader 18 in the probe card load port 16b, and transfers the new probe card 100 to the inspection device 15 of the inspection room 12a. In this manner, the substrate inspection apparatus 10 is configured to allow the probe card 100 to be replaced.

Figure 2:
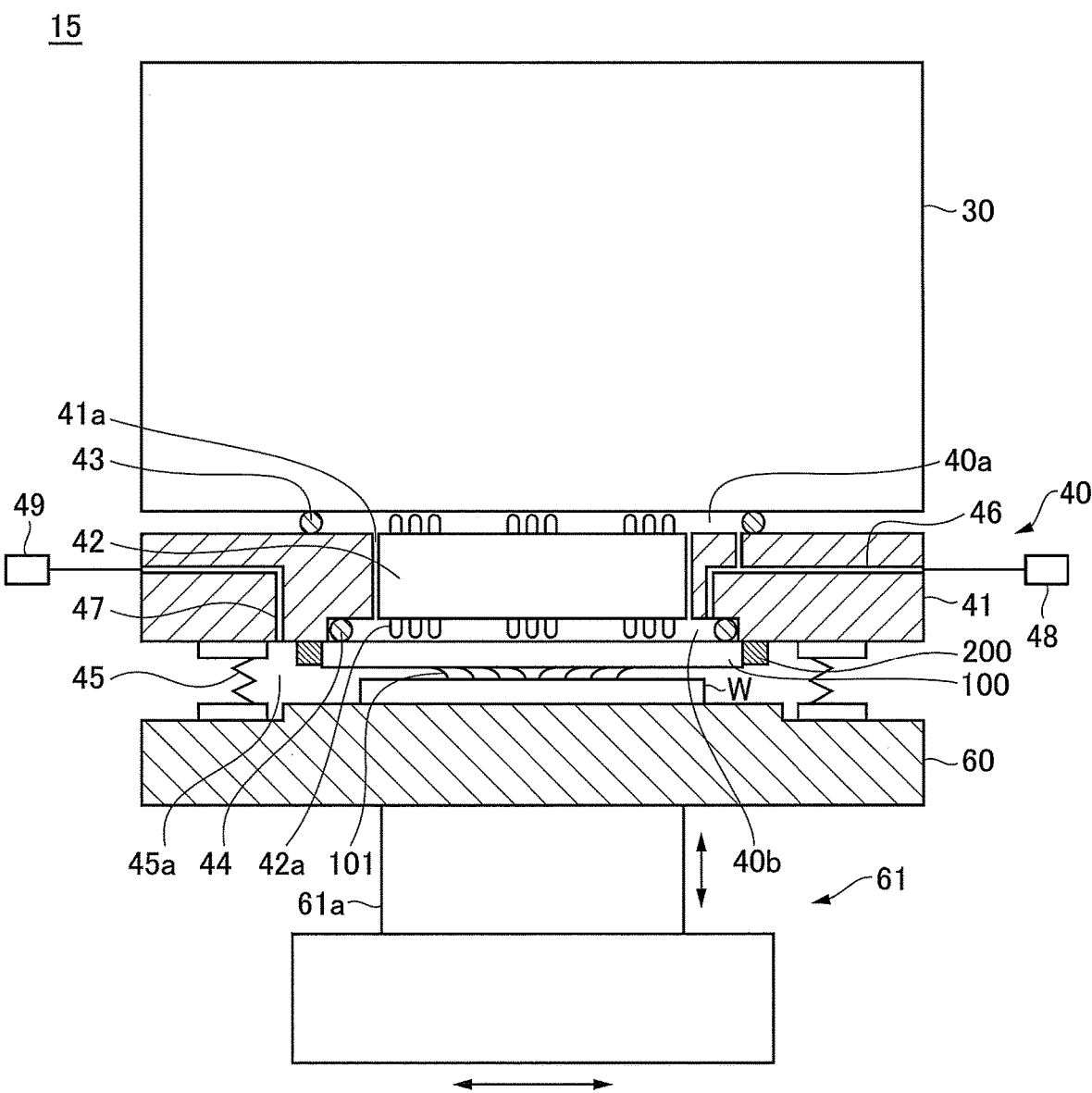
FIG. 2 is an example of a cross-sectional view schematically illustrating the configuration of an inspection device.

Next, the inspection device 15 will be further described with reference to FIG. 2. FIG. 2 is an example of a cross-sectional view schematically illustrating the configuration of the inspection device 15 according to the present embodiment.

The inspection device 15 includes a tester 30, an interface portion 40, a chuck top 60, and an aligner 61. The interface portion 40 includes a pogo frame 41, a pogo block 42, sealing members 43 and 44, and a bellows 45.

The tester 30 is mounted on the pogo frame 41 fixed to a device frame (not illustrated). The probe card 100 is mounted under the pogo frame 41.

On the upper surface of the probe card 100, a large number of electrodes (not illustrated) are provided. On the bottom surface of the probe card 100, a large number of contact probes 101 are provided. Each of the contact probes 101 is connected to a corresponding electrode (not illustrated). When a wafer W is brought into contact with the probe card 100, the contact probes 101 electrically contact electrode pads or solder bumps of semiconductor devices formed in the wafer W. The multiple contact probes 101 are configured to be collectively contactable, for example, on the entire surface of wafer W. This enables the inspection device 15 to conduct electrical property inspection of a large number of semiconductor devices simultaneously, thus reducing inspection time.

The pogo frame 41 has a through-hole 41a. The pogo block 42, which is formed by arranging a number of pogo pins 42a, is inserted into the through-hole 41a. The pogo pins 42a connect test circuitry (not illustrated) of the tester 30 to the electrodes (not illustrated) provided on the upper surface of the probe card 100.

A sealing member 43 is provided on the upper surface of the pogo frame 41. This forms an enclosed space 40a surrounded by the tester 30, the pogo frame 41, and the sealing member 43.

A sealing member 44 is provided on the bottom surface of the pogo frame 41. This forms an enclosed space 40b surrounded by the pogo frame 41, the probe card 100, and the sealing member 44.

An exhaust path 46 is formed within the pogo frame 41. One end of the exhaust path 46 is connected to a line extending from a vacuum mechanism 48. The other end of the exhaust path 46 branches partway, and paths that branch from the other end of the exhaust path 46 are connected to the enclosed space 40a and the enclosed space 40b respectively. The vacuum mechanism 48 includes a vacuum pump. The enclosed space 40a is evacuated by the vacuum mechanism 48 to reduce the pressure in the enclosed space 40a, and the tester 30 is drawn toward the pogo frame 41 by vacuum suction. The enclosed space 40b is also depressurized and the probe card 100 is drawn toward the pogo frame 41 by vacuum suction.

The bellows 45 of a cylindrical shape is provided at the bottom surface of the pogo frame 41 to surround an area in which the probe card 100 is provided. A sealing member (not illustrated) is provided between the lower end of the bellows 45 and the chuck top 60. This forms an enclosed space 45a in the bellows 45.

An exhaust path 47 is formed within the pogo frame 41. One end of the exhaust path 47 is connected to a line extending from a vacuum mechanism 49. The other end of the exhaust path 47 communicates with the enclosed space 45a. The vacuum mechanism 49 includes a vacuum pump. The enclosed space 45a is evacuated by the vacuum mechanism 49 to depressurize the enclosed space 45a, and the chuck top 60 is drawn toward the pogo frame 41 by vacuum suction.

The chuck top 60 holds a wafer W by vacuum suction force. The aligner 61 is provided under the chuck top 60, to support the chuck top 60. The aligner 61 moves the chuck top 60 in the horizontal direction, and rotates the chuck top 60 around a vertical axis of the aligner 61. By the above-described movement of the aligner 61, the aligner 61 aligns the wafer W so that the wafer W faces the probe card 100. The aligner 61 also moves the chuck top 60 up and down by an elevator 61a. Accordingly, the enclosed space 45a is formed by the chuck top 60 and the bellows 45, and by evacuating the enclosed space 45a by the vacuum mechanism 49, the chuck top 60 is drawn toward the pogo frame 41 by vacuum suction. Also, the wafer W placed on the chuck top 60 contacts the contact probes 101. The aligner 61 is used by the six inspection devices 15 in the inspection area 12 (see FIG. 1) in common, and can move along the direction in which the inspection rooms 12a (or the inspection devices 15) are arranged. While the chuck top 60 of one of the inspection devices 15 is drawn toward the pogo frame 41 by vacuum suction, the aligner 61 can align the chuck top 60 of another inspection device 15.

In addition, the inspection device 15 includes a probe card detachment prevention device 200 for holding the probe card 100 when provision of vacuum suction force of drawing the probe card 100 is stopped. The probe card detachment prevention device 200 will be further described with reference to FIG. 3 to FIG. 5D.

Figure 3:
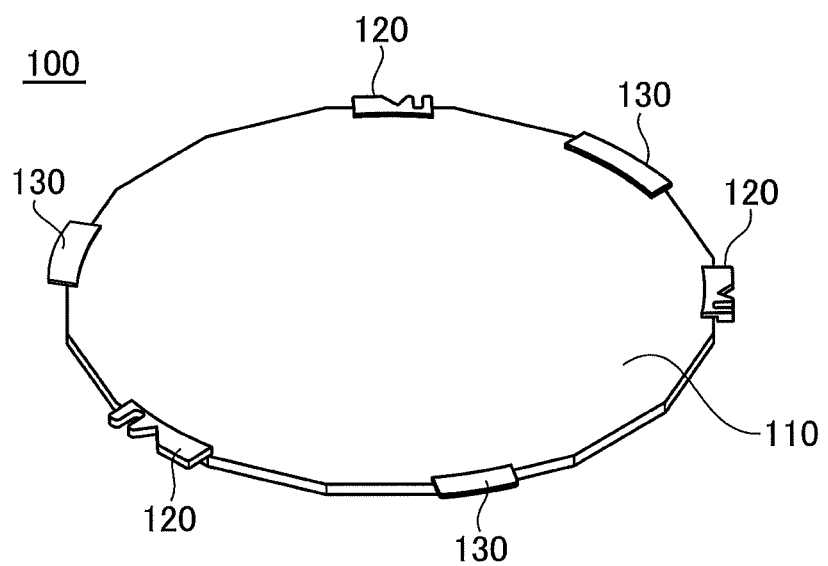
FIG. 3 is an example of a perspective view of a probe card.

First, the probe card 100, which is held by the probe card detachment prevention device 200 will be described with reference to FIG. 3 in detail. FIG. 3 is an example of a perspective view of the probe card 100. FIG. 3 is a perspective view of the probe card 100 viewed from above.

The probe card 100 has a plate-like probe card body 110. On the bottom surface of the probe card body 110, the multiple contact probes 101 (see FIG. 2) are formed.

On the upper surface of the probe card body 110, alignment brackets 120 are provided at the periphery. The alignment brackets 120 are provided so as to protrude outward from the periphery of the probe card body 110. In the example illustrated in FIG. 2, three alignment brackets 120 are provided at regular intervals. The alignment bracket 120 aligns the probe card 100 by engaging with a notch 211, which will be described below, when the probe card 100 is attached to the pogo frame 41. A shape of at least one of the three alignment brackets 120 may be different from that of the other alignment brackets 120. This prevents incorrect mounting.

On the upper surface of the probe card body 110, engagement brackets 130 are provided at the periphery. In the present specification, the engagement bracket 130 may also be referred to as a "first engaging portion". The engagement brackets 130 are provided so as to protrude outward from the periphery of the probe card body 110. In the example illustrated in FIG. 3, three engagement brackets 130 are provided at regular intervals. When the probe card 100 is attached to the pogo frame 41, each of the engagement brackets 130 is disposed in a notch 212, which will be described below. The three engagement brackets 130 may also have different shapes from each other.

Figure 4A:
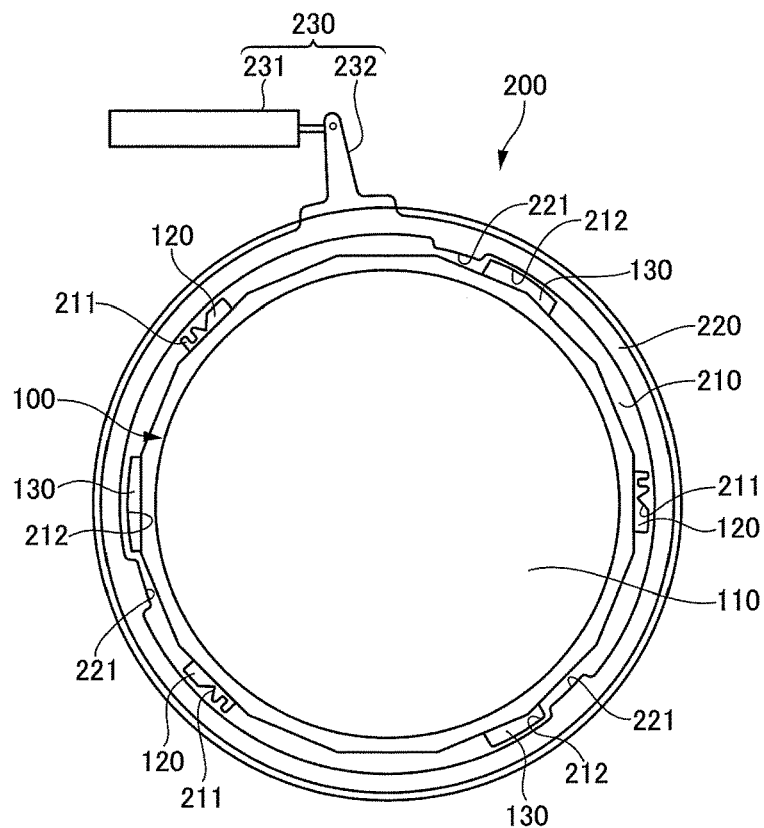
FIGS. 4A and 4B are examples of a plan view of a probe card detachment prevention device.
Figure 4B:
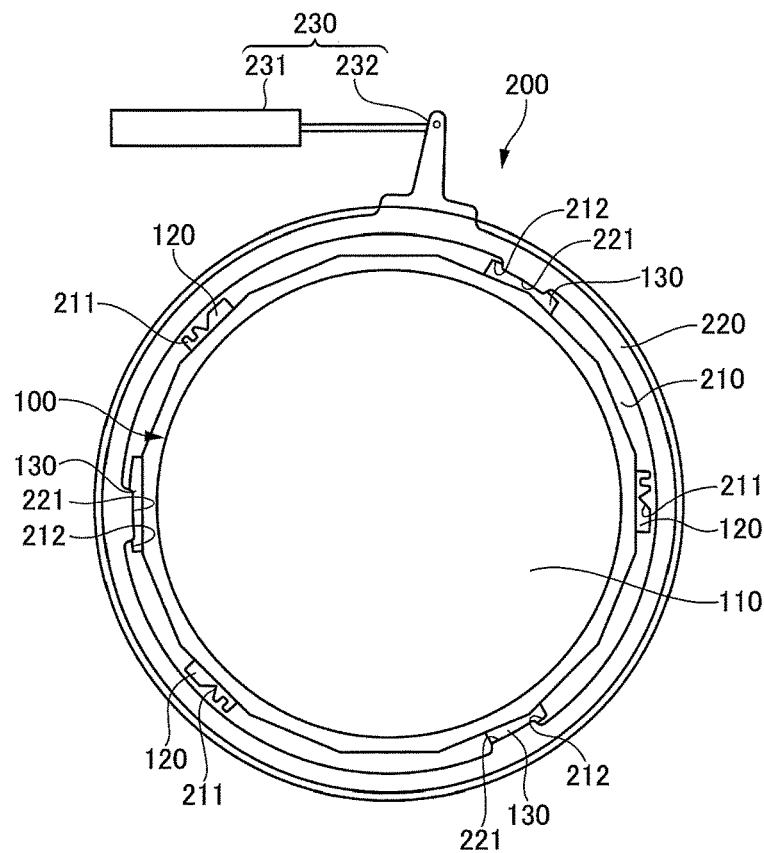

Next, the probe card detachment prevention device 200 will be described with reference to FIGS. 4A to 5D. FIGS. 4A and 4B each illustrate an example of a plan view of the probe card detachment prevention device 200. FIG. 4A illustrates a first state, and FIG. 4B illustrates a second state. Details of the first state and the second state will be described below. Note that FIGS. 4A and 4B are diagrams each illustrating a case in which the probe card detachment prevention device 200 is viewed from below. Also, FIGS. 4A and 4B each illustrates a state in which the probe card 100 is attached to the probe card detachment prevention device 200. In FIGS. 4A and 4B, illustration of the contact probes 101 (see FIG. 2) is omitted.

The probe card detachment prevention device 200 includes a ring member 210, an engaging ring 220, and an actuator 230.

The ring member 210 is secured to the bottom surface of the pogo frame 41, and is disposed outside the sealing member 44. At the inner periphery of the ring member 210, the notches 211 and 212 are provided. The notch 211 is engaged with the alignment bracket 120 when the probe card 100 is attached to the pogo frame 41. When the probe card 100 is attached to the pogo frame 41, the engagement bracket 130 is placed in the notch 212 in a plan view. The notch 212 may also be referred to as a "placement section". A guide 213 (see FIGS. 5A to 5D) is formed on the outer peripheral side of the ring member 210 to rotatably guide the engaging ring 220.

The engaging ring 220 is rotatably attached to the pogo frame 41 via the ring member 210. Engaging portions 221 are provided at the inner circumference of the engaging ring 220. In the present specification, the engaging portion 221 may also be referred to as a "second engaging portion".

The actuator 230 drives the engaging ring 220 so as to rotate the engaging ring 220. The actuator 230 includes, for example, an extensible cylinder 231, and a link bar 232 extending from the outer circumference of the engaging ring 220. An end of the cylinder 231 is supported such that the cylinder 231 can swing. As the cylinder 231 expands and contracts, the cylinder 231 can rotate the engaging ring 220 through the link bar 232. Accordingly, the actuator 230 can switch a state of the engaging ring 220 between a first state in which the engaging portion 221 is in a position to avoid the notch 212 in a plan view (see FIG. 4A) and a second state in which the engaging portion 221 is in a position to overlap with the notch 212 in a plan view (see FIG. 4B).

The configuration of the engaging ring 220 and the actuator 230 is not limited thereto. Any configuration may be possible as long as the state of the engaging ring 220 can be switched between a state in which the engaging portion 221 is in a position to avoid the notch 212 (the first state) and a state in which the engaging portion 221 is in a position to overlap with the notch 212 (the second state). The configuration illustrated in FIG. 3 is preferable because states of the three engaging portions 221 can be switched by a single actuator 230.

FIGS. 5A to 5D are examples of a partially enlarged cross-sectional view of the inspection device 15 according to the present embodiment.

Here, a probe card holding device that holds the probe card 100 on the pogo frame 41 includes the pogo frame 41, the sealing member 44, the vacuum mechanism 48, and the probe card detachment prevention device 200.

Figure 5A:
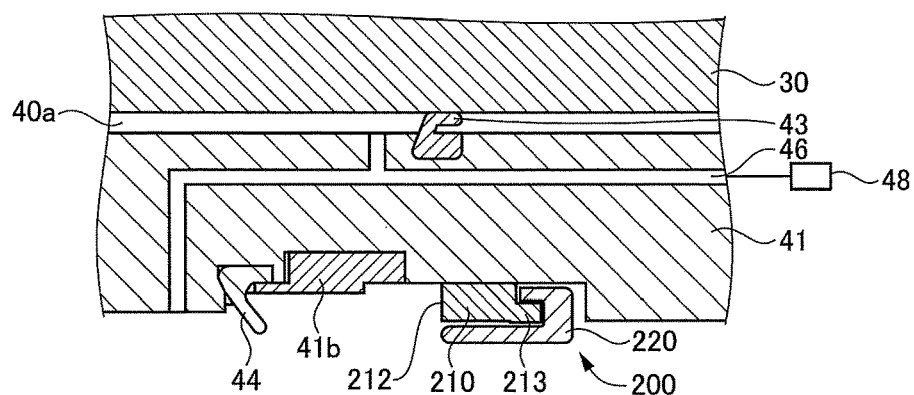
FIGS. 5A to 5D are examples of a partially enlarged cross-sectional view of the inspection device.

FIG. 5A illustrates a state before the probe card 100 is attached to the pogo frame 41. The engaging ring 220 is in a state in which the engaging portion 221 is in a position to avoid the notch 212 (the first state; see FIG. 4A), and the notch 212 opens downward.

Figure 5B:
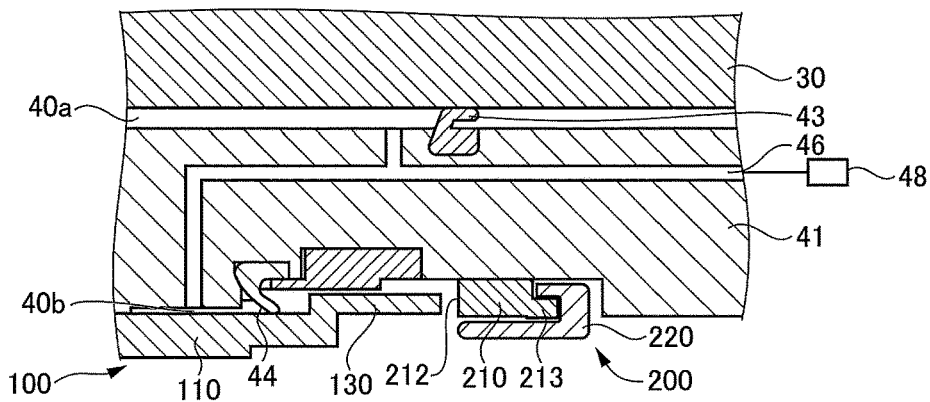

FIG. 5B illustrates a state in which the probe card 100 is attached to the pogo frame 41. The probe card 100 is attached to the lower surface of the pogo frame 41 by, for example, the conveying device 20 lifting the probe card 100 by supporting the alignment brackets 120 from below. In this case, as the alignment brackets 120 are engaged With the notch 211, alignment of the probe card 100 is made. Also, the engagement brackets 130 are disposed at the notches 212. The sealing member 44 contacts the upper surface of the probe card body 110 to form the enclosed space 40b. As the enclosed space 40b is evacuated with the vacuum mechanism 48, the probe card 100 is drawn toward the pogo frame 41 by vacuum suction force.

Figure 5C:
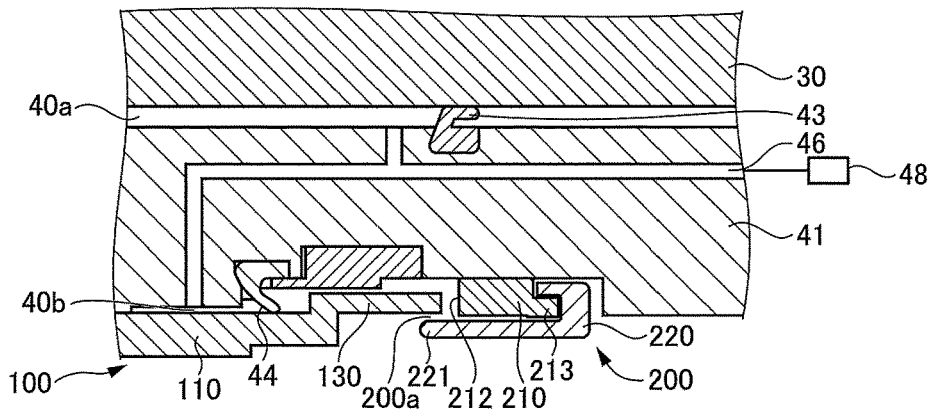

FIG. 5C illustrates a state in which the probe card detachment prevention device 200 is functioning. The engaging ring 220 is rotated by the actuator 230 to set the engaging ring 220 to a state in which the engaging portion 221 overlaps the notch 212 (the second state; see FIG. 4B). This causes the engaging portion 221 to be provided below the engagement bracket 130 disposed at the notch 212. Subsequently, the conveying device 20 that supports the probe card 100 is withdrawn from the inspection room 12a.

In a sequence of operations described above, the probe card detachment prevention device 200 is set to the second state after the probe card 100 attached to the bottom surface of the pogo frame 41 by the conveying device 20 has been drawn toward the pogo frame 41 by vacuum force, and the conveying device 20 is withdrawn from the inspection room 12a. However, the order of the operations is not limited thereto. For example, the probe card detachment prevention device 200 may be set to the second state before the probe card 100 attached to the bottom surface of the pogo frame 41 by the conveying device 20 has been drawn toward the pogo frame 41 by vacuum force, and after the probe card 100 is drawn toward the pogo frame 41 by vacuum force, the conveying device 20 may be withdrawn from the inspection room 12a.

Here, the engagement bracket 130 and the engaging portion 221 are spaced apart, with a gap 200a between the engagement bracket 130 and the engaging portion 221. That is, the probe card holding device secures the probe card 100 to the pogo frame 41 by vacuum suction. Thus, compared to a configuration for mechanically clamping the perimeter of the probe card 100, deformation of the probe card 100 can be suppressed.

Figure 5D:
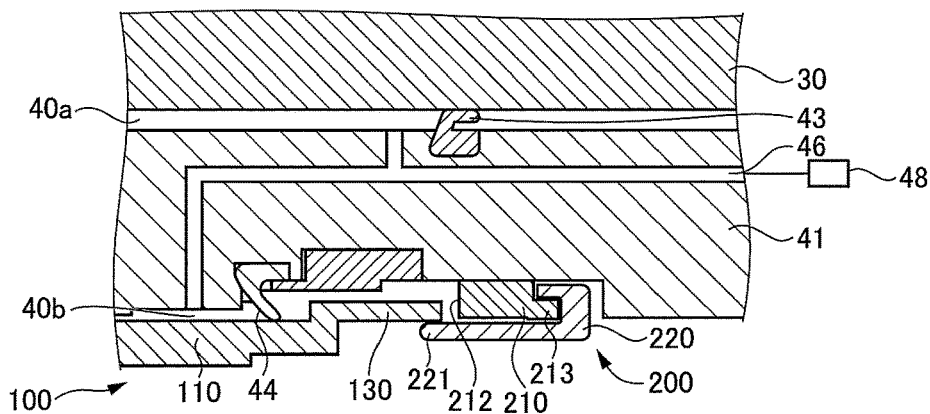

Here, a state in which vacuum suction is lost by, for example, stopping the vacuum pump of the vacuum mechanism 48 is illustrated in FIG. 5D. As illustrated in FIG. 5D, because the engagement bracket 130 of the probe card 100 engages the engaging portion 221 when the vacuum suction is lost, the probe card 100 does not fall further. This prevents damage caused by dropping the probe card 100.

Further, in the state illustrated in FIG. 5D, the sealing member 44 is deformed elastically, and maintains a seal (contact) with the upper surface of the probe card 100. Accordingly, by restarting the vacuum mechanism 48, the enclosed space 40b can be depressurized, vacuum suction can be easily restored, and the state of the probe card detachment prevention device 200 is restored to the state illustrated in FIG. 5C. That is, processes of receiving the probe card 100 at the conveying device 20 and attaching the probe card 100 to the pogo frame 41 again can be eliminated.

The gap 200a illustrated in FIG. 5C is smaller than the plate thickness of the engagement bracket 130. This allows the upper side of the engagement bracket 130 to remain disposed within the notch 212 in the condition illustrated in FIG. 5D. This eliminates the need to realign the probe card 100 when the vacuum mechanism 48 is restarted.

As described above, the probe card holding device draws the probe card 100 to the bottom surface of the pogo frame 41 by vacuum suction. Even if dissipation of the vacuum suction occurs, damage caused by dropping of the probe card 100 can be prevented. Also, by restarting the vacuum mechanism 48, the vacuum suction can be restored easily.

Although the substrate inspection apparatus 10 has been described above, the present disclosure is not limited to the above-described embodiment, and various modifications and enhancements can be made within the scope of the gist of the present disclosure as claimed.

In the above description, a case in which the substrate inspection apparatus 10 includes multiple inspection rooms 12a and in which multiple wafers W can be inspected simultaneously has been described. However, the configuration of the substrate inspection apparatus 10 is not limited thereto. The above-described probe card holding device can also be applied to a substrate inspection apparatus having a single inspection room.

The number of the engagement brackets 130 is not limited to three, and may be two or more. For example, in the case of an arrangement such that the engaging portion 221 enters and leaves the probe card 100 in the radial direction of the probe card 100, a single engagement bracket 130, which is formed, for example, in an entire circumference, may be formed. The alignment bracket 120 and the engagement bracket 130 may also be integrally formed.

What is claimed is:

1. A probe card holding device comprising:
   a frame that holds a probe card by vacuum suction, the probe card being provided with a first engaging portion at an outer circumference of the probe card;
   a sealing member provided on the frame, the sealing member being configured to form an enclosed space by contacting the probe card;
   a placement section in which the first engaging portion of the probe card is placed when the probe card is attached to the frame;
   a second engaging portion configured to be engaged with the first engaging portion; and
   an actuator configured to drive the second engaging portion; wherein
      the actuator is configured to switch a position of the second engaging portion between a first position in which the second engaging portion is placed to avoid the placement section and a second position in which the second engaging portion is placed to overlap with the placement section; and
      in a case in which the second engaging portion is engaged with the first engaging portion in response to dissipation of the vacuum suction, the probe card is held by the probe card holding device while the sealing member maintains a seal with the probe card.

2. The probe card holding device according to claim 1, wherein
   in a case in which the second engaging portion is engaged with the first engaging portion in response to the dissipation of the vacuum suction, the probe card is held by the probe card holding device while the sealing member is elastically deformed.

3. The probe card holding device according to claim 2, further comprising an annular member, wherein
   the second engaging portion is provided at an inner circumference of the annular member; and
   the actuator is configured to rotate the annular member.

4. The probe card holding device according to claim 3, wherein the first engaging portion is separated from the second engaging portion while the probe card is drawn toward the frame by the vacuum suction.

5. The probe card holding device according to claim 1, further comprising an annular member, wherein
   the second engaging portion is provided at an inner circumference of the annular member; and
   the actuator is configured to rotate the annular member.

6. The probe card holding device according to claim 1, wherein the first engaging portion is separated from the second engaging portion while the probe card is drawn toward the frame by the vacuum suction.

7. An inspection device comprising the probe card holding device according to claim 1.

* * * * *